United States Patent

Rodgers et al.

Patent Number: 6,082,208
Date of Patent: Jul. 4, 2000

[54] METHOD FOR FABRICATING FIVE-LEVEL MICROELECTROMECHANICAL STRUCTURES AND MICROELECTROMECHANICAL TRANSMISSION FORMED

[75] Inventors: M. Steven Rodgers, Albuquerque; Jeffry J. Sniegowski, Edgewood; Samuel L. Miller; Paul J. McWhorter, both of Albuquerque, all of N. Mex.

[73] Assignee: Sandia Corporation, Albuquerque, N. Mex.

[21] Appl. No.: 09/053,569

[22] Filed: Apr. 1, 1998

[51] Int. Cl.7 .................................................. F16H 57/00
[52] U.S. Cl. .............................. 74/406; 74/405; 310/309; 310/40 MM; 310/DIG. 6
[58] Field of Search ..................... 74/405, 406; 310/309, 310/40 MM, DIG. 6

[56] References Cited

U.S. PATENT DOCUMENTS

| | | | |
|---|---|---|---|
| 5,013,954 | 5/1991 | Shibaike et al. | 310/309 |
| 5,425,989 | 6/1995 | Ogawa et al. | 428/333 |
| 5,567,332 | 10/1996 | Mehta | 216/57 |
| 5,626,040 | 5/1997 | Benavides | 70/290 |
| 5,628,871 | 5/1997 | Shinagawa | 438/514 |
| 5,631,514 | 5/1997 | Garcia | 310/309 |
| 5,731,077 | 3/1998 | Ogawa et al. | 428/333 |
| 5,876,801 | 3/1999 | Ogawa et al. | 428/387 |
| 5,876,846 | 3/1999 | Ogawa et al. | 428/333 |

*Primary Examiner*—David M. Fenstermacher
*Attorney, Agent, or Firm*—John P. Hohimer

[57] ABSTRACT

A process for forming complex microelectromechanical (MEM) devices having five layers or levels of polysilicon, including four structural polysilicon layers wherein mechanical elements can be formed, and an underlying polysilicon layer forming a voltage reference plane. A particular type of MEM device that can be formed with the five-level polysilicon process is a MEM transmission for controlling or interlocking mechanical power transfer between an electrostatic motor and a self-assembling structure (e.g. a hinged pop-up mirror for use with an incident laser beam). The MEM transmission is based on an incomplete gear train and a bridging set of gears that can be moved into place to complete the gear train to enable power transfer. The MEM transmission has particular applications as a safety component for surety, and for this purpose can incorporate a pin-in-maze discriminator responsive to a coded input signal.

36 Claims, 8 Drawing Sheets

Cross-Section 1 - 1

Cross-Section 2 - 2

6,082,208

METHOD FOR FABRICATING FIVE-LEVEL MICROELECTROMECHANICAL STRUCTURES AND MICROELECTROMECHANICAL TRANSMISSION FORMED

GOVERNMENT RIGHTS

This invention was made with Government support under Contract No. DE-AC04-94AL85000 awarded by the U.S. Department of Energy. The Government has certain rights in the invention.

FIELD OF THE INVENTION

The present invention relates generally to microelectromechanical (MEM) devices, and in particular to a method for forming MEM structures using a five-level polysilicon process and to a MEM transmission formed thereby for controlling or interlocking the transfer of mechanical power from a motive source to a load.

BACKGROUND OF THE INVENTION

Polysilicon surface micromachining uses planar fabrication process steps common to the integrated circuit (IC) fabrication industry to manufacture microelectromechanical or micromechanical devices. The standard building-block process consists of depositing and photolithographically patterning alternate layers of low-stress polycrystalline silicon (also termed polysilicon) and a sacrificial material such as silicon dioxide. Vias etched through the sacrificial layers provide anchor points to a substrate and between the polysilicon layers which are patterned to build up mechanical elements of the device layer by layer by a series of deposition and patterning process steps. The silicon dioxide layers can then be removed by exposure to a selective etchant such as hydrofluoric acid (HF) which does not attack the polysilicon layers to release the completed device for movement thereof.

The result is a construction system generally consisting of a first layer of polysilicon which provides electrical interconnections and/or a voltage reference plane, and up to three additional layers of mechanical polysilicon which are used to form mechanical elements ranging from simple cantilevered beams to complex systems such as an electrostatic motor connected to a plurality of gears. Typical in-plane lateral dimensions can range from one micron to several hundred microns, while the layer thicknesses are typically about 1–2 microns. Because the entire process is based on standard IC fabrication technology, hundreds to thousands of devices can be batch-fabricated, fully assembled (without any need for piece-part assembly) on a single silicon substrate.

The present invention provides an advance in the art of silicon micromachining by overcoming impediments that have heretofore prevented the development of a MEM devices having five levels of polysilicon. The five-level polysilicon process as disclosed herein allows the formation of MEM devices of a greatly increased complexity as compared with the prior art. As an example of the utility of the five-level polysilicon process of the present invention for forming complex MEM devices, a MEM transmission is disclosed that can be used to control or interlock mechanical coupling between an electrostatic motor and a self-assembling MEM structure in the form of a hinged or pop-up mirror.

An advantage of the method of the present invention is that a residual stress buildup can be overcome which has heretofore prevented the formation of MEM devices using five layers of polysilicon.

Another advantage of the present invention is that MEM structures or devices can be formed with a level of complexity and functionality heretofore unattainable.

A further advantage of the present invention is that MEM structures or devices having a high level of complexity can be formed without a need for piece part assembly.

Yet another advantage is that a MEM apparatus (herein termed a transmission) can be formed using the five-level polysilicon process of the present invention to provide control over the transfer of power from a motive source such as a MEM motor to a load such as a self-assembling MEM structure.

Still another advantage is that the MEM transmission formed using the five-level polysilicon process of the present invention can be used as a surety interlock to prevent unauthorized operation of a MEM device until enabled to bring a bridging gear set into position to complete an otherwise incomplete or interrupted gear train and thereby permit power to be transferred from a motive source (e.g. an electrostatic motor) to a load.

These and other advantages of the method of the present invention will become evident to those skilled in the art.

SUMMARY OF THE INVENTION

The present invention relates to a method for forming microelectromechanical (MEM) structures or devices using five layers or levels of polysilicon, and to a MEM apparatus (i.e. a device) formed by the method. The method of the present invention comprises process steps for depositing and patterning five layers of polysilicon above a silicon substrate, including a first polysilicon layer forming a voltage reference plane, and four polysilicon layers overlying the first polysilicon layer for forming structural layers wherein mechanical elements of the MEM apparatus are formed. The method further comprises steps for annealing each of the first, second and third structural polysilicon layers prior to patterning each of these layers; and a step for annealing the fourth structural polysilicon layer after patterning thereof. Additionally, method of the present invention preferably includes the steps of depositing a sacrificial layer between each layer of polysilicon, planarizing one or more sacrificial layers after deposition thereof (preferably by chemical-mechanical polishing), patterning each sacrificial layer, and releasing the MEM apparatus by removing, at least in part, the sacrificial layers by etching.

The present invention further relates to a MEM apparatus (termed herein a MEM transmission) formed using the five-level polysilicon process. In its simplest form, the MEM apparatus comprises a plurality of gears on a substrate forming an incomplete gear train, and a bridging set of gears on the substrate and moveable to engage the plurality of gears, thereby completing the gear train. The MEM transmission can be used to control or interlock the transfer of power from a motive source such as an electrostatic motor to a load such as a self-assembled MEM structure (e.g. a self-assembled mirror). In a preferred embodiment of the present invention, the MEM apparatus can comprise an incomplete or interruptible gear train formed on a silicon substrate, with the interruptible gear train further comprising a first set of meshed gears operatively connected to the motive source; a second set of meshed gears operatively connected to the load; and a bridging gear set that is moveable along a track for engagement with the first and second sets of meshed gears thereby enabling power transfer from the motive source to the load. The interruptible gear train generally comprises a reducing gear train for reducing a rotation speed of the motive source, with each gear in the train being formed from polysilicon (i.e. polycrystalline silicon).

According to the present invention, the bridging gear set can comprise one or more gears, each formed on a hub with the hub being secured to a moveable plate or carriage, and with the carriage having opposite sides thereof slidingly engaged with guide rails of the track to provide for linear movement of the carriage and bridging gear set along the track. The carriage can further comprise a linear gear formed on one side of the carriage to impart linear motion to the carriage (e.g. using another motive source operatively connected to drive the linear gear). The moveable carriage can further include a first interdental stop moveable between an engaged position and a disengaged position, with the first interdental stop being initially formed in the engaged position preventing rotation of any of the gears in the bridging gear set to facilitate engagement thereof with the first and second sets of meshed gears, and with the first interdental stop being moveable to the disengaged position upon engagement of the bridging gear set with the first and second sets of meshed gears. A second interdental stop can be provided to prevent rotation of the first and second sets of meshed gears, with the second interdental stop being moveable from an engaged position whereby rotation of the sets of meshed gears is prevented to a disengaged position whereby the sets of meshed gears are rotatable upon engagement of the bridging gear set with the first and second sets of meshed gears. The MEM apparatus can further include a spring retainer for locking each interdental stop in the disengaged position upon engagement of the bridging gear set with the first and second sets of meshed gears.

Additional advantages and novel features of the invention will become apparent to those skilled in the art upon examination of the following detailed description thereof when considered in conjunction with the accompanying drawings. The advantages of the invention can be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several aspects of the present invention and, together with the description, serve to explain the principles of the invention. The drawings are only for the purpose of illustrating preferred embodiments of the invention and are not to be construed as limiting the invention. In the drawings:

FIG. 3b shows a schematic cross-section view along the line 1—1 in FIG. 3a.

FIG. 4b shows a schematic cross-section view along the line 2—2 in FIG. 4a.

DETAILED DESCRIPTION OF THE INVENTION

Figure 1:
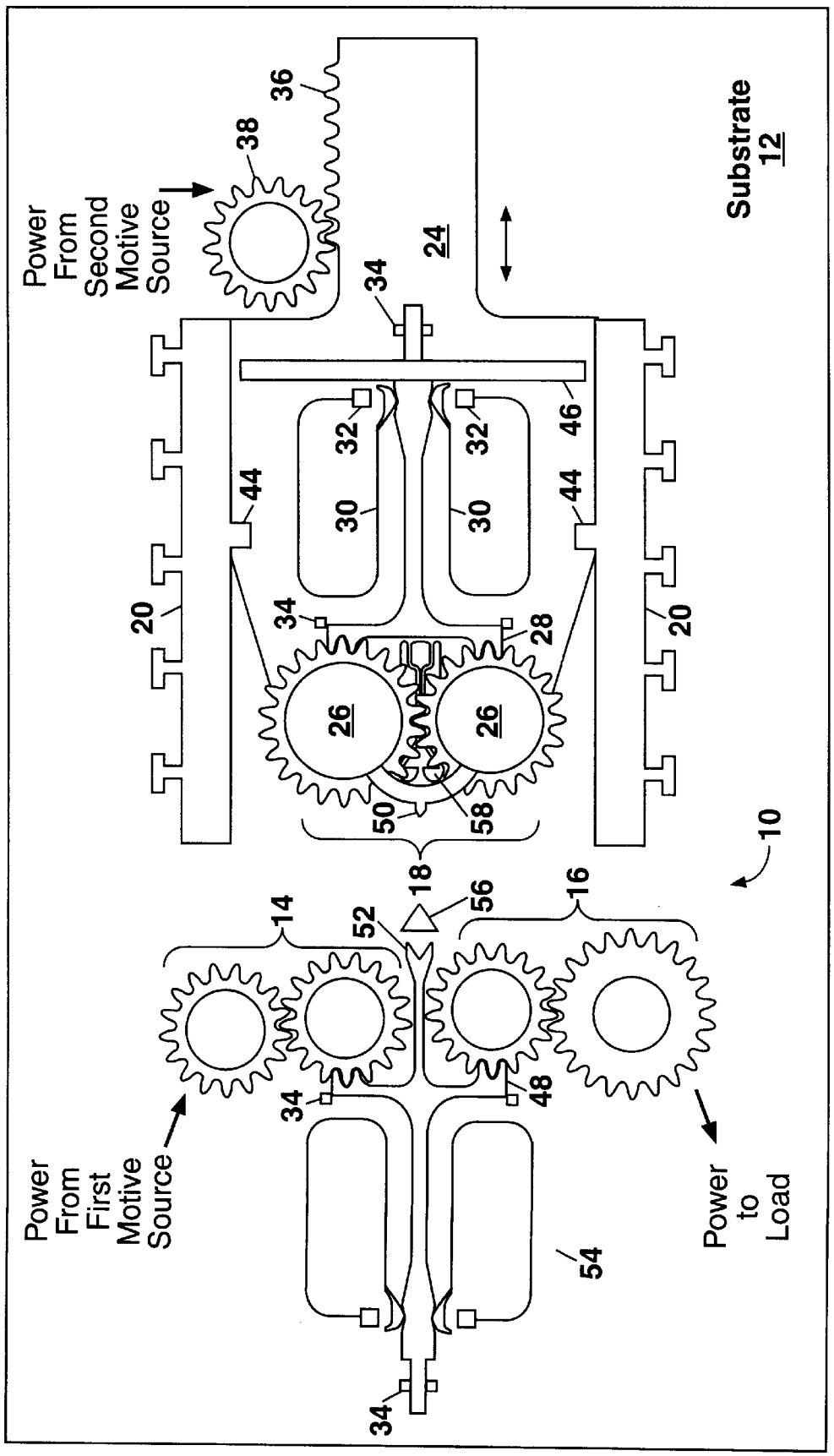
FIG. 1 shows a schematic representation of an embodiment of the MEM apparatus of the present invention with the carriage and bridging gear set being positioned to prevent power transfer across the interruptible gear train.

Referring to FIG. 1, there is shown schematically an example of a MEM apparatus 10 that is formed monolithically on a substrate 12 using the five-level polysilicon process of the present invention. The MEM apparatus 10 in FIG. 1 comprises an interruptible gear train which further comprises a plurality of gears forming an incomplete train and a bridging gear set that is moveable to complete the gear train. The plurality of gears are generally configured as a first set of meshed gears 14 and a second set of meshed gears 16 that are spaced apart by a gap to prevent any mechanical coupling between the two sets of meshed gears, 14 and 16, until a bridging gear set 18, separate from the plurality of gears, is displaced along a track comprising a pair of guide rails 20 and engaged with the two sets of meshed gears to bridge the gap and thereby enable mechanical coupling therebetween (compare FIG. 1 which shows the MEM apparatus 10 in a "disengaged" mechanical state with FIG. 5 which shows the apparatus 10 in an "engaged" state). The MEM apparatus 10 thus forms an interruptible gear train or MEM transmission that has applications for interlocking and controlling the transfer of mechanical power from a motive source such as an electrostatic motor to a mechanical load such as a self-assembled MEM structure. An electrostatic motor suitable for use with the present invention is described in U.S. Pat. No. 5,631,514 which is incorporated herein by reference.

In FIG. 1, the MEM apparatus 10 is formed on a silicon substrate 12 using surface micromachining processes. The surface micromachining processes are based on steps for depositing and photolithographically patterning alternate layers of low-stress polycrystalline silicon (also termed polysilicon) and a sacrificial material (e.g. silicon dioxide or a silicate glass) to build up the layer structure of the MEM apparatus 10 and thereby form each of the mechanical elements and features thereof as shown in FIG. 1. Altogether, five layers (also termed levels herein) of polysilicon are used to form both structural and non-structural films.

A silicon substrate 12 is initially prepared by blanketing the substrate 12 with a layer of thermal oxide (e.g. 630 nanometers thick) formed by a conventional wet oxidation process at an elevated temperature (e.g 1050° C. for about 1.5 hours). A layer of low-stress silicon nitride (e.g. 800 nanometers thick) is then deposited over the thermal oxide layer using low-pressure chemical vapor deposition (LPCVD) at about 850° C. The thermal oxide and silicon nitride layers provide electrical isolation from the substrate for a subsequently-deposited first polysilicon layer.

The first polysilicon layer is deposited over the substrate 12, blanketing the silicon nitride layer, which can be patterned to provide one or more vias or through holes so that the first polysilicon layer can electrically contact the substrate 12. All polysilicon depositions described herein are performed by LPCVD at a temperature of about 580° C. Phosphorous doping can be used to make the first polysilicon layer and other of the polysilicon layers electrically conductive as needed (e.g. for forming electrostatic motors or actuators, and electrical interconnections thereto). The first polysilicon layer can be about 300 nanometers thick, and is used to form a voltage reference plane for electrical elements (e.g. electrostatic comb actuators) on the substrate 12. An additional four layers of polysilicon are also preferably deposited by LPCVD, with typical layer thicknesses on the order of 0.5–2 μm or more. These additional polysilicon layers are used as structural layers to form the MEM apparatus 10.

The polysilicon layers are separated by sacrificial layers of silicon dioxide or silicate glass (e.g. a plasma-enhanced CVD oxide, also termed PECVD oxide; or a silicate glass deposited from the decomposition of tetraethylortho silicate, also termed TEOS, by LPCVD at about 750° C. and densified by a high temperature processing) having predetermined layer thicknesses (e.g. 0.5–2 μm) that are generally comprable to the thicknesses of adjacent polysilicon layers.

The sacrificial layers are deposited to cover each succeeding polysilicon layer as needed, and to fill in spaces between mechanical elements or features thereof formed in the polysilicon layers. One or more sacrificial layers are then preferably planarized by chemical-mechanical polishing (CMP). Chemical-mechanical polishing is also advantageous for precisely adjusting the thickness of one or more of the sacrificial layers as needed to provide precise vertical dimensioning of mechanical elements of the apparatus 10, and can include polishing down to expose the underlying polysilicon layer, and then depositing a thin layer of sacrificial material to a desired thickness. Additionally, CMP eliminates stringers formed by anisotropic etching (e.g. reactive ion etching) of polysilicon layers and can prevent mechanical interferences between structural members formed in adjacent polysilicon layers. Without the use of chemical-mechanical polishing, the surface topography would become increasingly severe as each succeeding polysilicon or sacrificial layer is deposited upon an underlying patterned layer of material.

After each CMP process step, the resulting planarized sacrificial layer can be patterned by photolithographic definition and etching steps (e.g. reactive ion etching) to provide shaped openings for the subsequent deposition of an overlying layer of polysilicon. These shaped openings can be used for molding of mechanical elements or features thereof from the subsequently deposited polysilicon, or to form vias (i.e. through holes) wherein polysilicon can be deposited to interconnect adjacent polysilicon layers. Additionally, one or more of the patterned sacrificial layers can be used as an etch mask for anisotropically etching an underlying polysilicon layer.

Mechanical stress can accumulate due to successive depositions of the polysilicon and sacrificial material resulting in distortion or bowing of the substrate or wafer. If not relieved, this stress can be problematic for photolithographic definition of the uppermost deposited layers (especially the fifth polysilicon layer). Additionally, it is essential to relieve stress in the polysilicon layers to provide planar surfaces for large mechanical elements such as gears, especially when such elements are formed from the second, third, fourth and fifth polysilicon layers.

Normally, each structural polysilicon layer is annealed, for example, at a temperature of about 1100° C. for three hours in order to relieve stress in the polysilicon layer prior to photolithographically defining the layer. However, the buildup of multiple polysilicon layers and intervening sacrificial layers can result in residual stress (primarily in the sacrificial layers) that is not relieved after annealing. This was found to be the case after deposition and annealing of the fifth polysilicon layer when using TEOS to form the intervening sacrificial layers, with the residual stress producing wafer bowing that was substantial enough to prevent photolithographic definition of the fifth polysilicon layer after annealing thereof. This problem is solved, however, according to the present invention by switching the order of the steps for annealing and photolithographically defining the fifth polysilicon layer so that the fifth polysilicon layer is first photolithographically defined and etched, and then the annealing step is performed to relieve stress in the mechanical elements formed in the fifth polysilicon layer. Although the residual stress in the sacrificial layers still remains, this residual stress no longer prevents formation of a five-level polysilicon MEM device. Furthermore, this residual stress is removed upon release of the MEM device with removal of the sacrificial layers by etching.

To build up the structure of the MEM apparatus 10, the polysilicon or sacrificial layer deposition, photolithographic definition, and etching process steps are repeated multiple times using a total of 14 photolithographic masks. The MEM apparatus 10 can then be released for operation by selectively etching away the sacrificial layers using a selective etchant such as hydrofluoric acid (HF) that does not chemically attack the polysilicon layers. For this purpose, a plurality of access holes 22 are formed through the polysilicon layers to expose each sacrificial layer (see FIG. 2 and FIG. 7).

Figure 2:
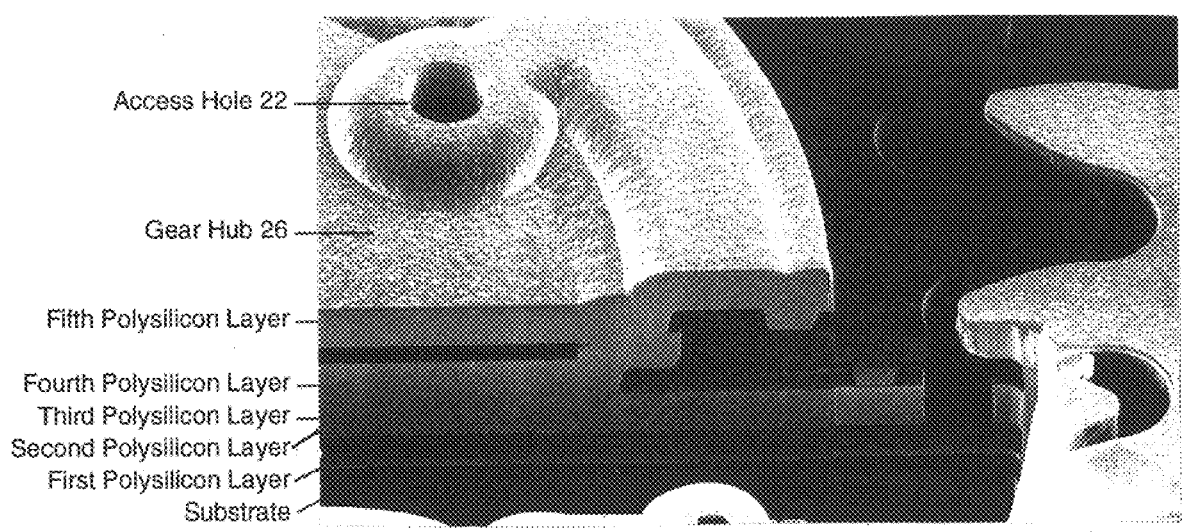
FIG. 2 shows an SEM photograph of a cross-section through one of the gears of the MEM apparatus with the individual polysilicon layers labelled for identification.

FIG. 2 shows a scanning electron microscope (SEM) photograph taken after focused ion milling through the bridging set of gears 18 to show the individual polysilicon layers therein. In FIG. 2, none of the sacrificial layers are present since the SEM photograph shows the completed device structure after the etch release process step. In FIG. 2, the various polysilicon layers are visible, with the second and third layers of polysilicon being laminated together to form a carriage 24 whereon the bridging set of gears 18 is formed from the fourth and fifth polysilicon layers. In FIG. 2, the fourth layer of polysilicon is used to form the gear itself; and the fourth and fifth layers of polysilicon are used to form a large-diameter hub 26 integrally with the carriage 24 to capture and support the gear. One of the access holes 22 formed in the hub for removal of the sacrificial layer beneath the carriage 24 is shown in FIG. 2. In FIG. 2, dimple rings are formed in the gear and the hub 26 to limit vertical play in the gear to sub-micron tolerances, thereby preventing tilting or vertical displacement of the gears in the bridging set 18 which could affect engagement of these gears with the first and second sets of meshed gears, 14 and 16.

Returning to FIG. 1, the carriage 24 and bridging set of gears 18 supported thereon can be seen in greater detail. In this embodiment of the present invention, the bridging set of gears 18 comprises a pair of meshed gears, each having a different number of teeth. The use of two gears of different sizes with different number of teeth is advantageous for allowing the gears in the set 18 to be fabricated so that they are aligned with each other, aligned with the first and second set of meshed gears 14 and 16 with which the bridging gear set 18 must engage, and aligned with a first interdental stop 28 which prevents rotation of the gears in the set 18 prior to engagement with the first and second sets of meshed gears, 14 and 16. By providing such alignment, the bridging gear set 18 can be made engageable with the first and second sets of meshed gears, 14 and 16, without the need for rotation of any of the gears in FIG. 1. In the embodiment of the present invention in FIG. 1, one of the gears in the set 18 has twenty teeth and the other gear in the set 18 has twenty-two teeth.

In FIG. 1, the first interdental stop 28 is shown in an engaged position with a toothed portion of the stop 28 being meshed with each of the gears in the bridging gear set 18, thereby preventing rotation of the gears and maintaining alignment thereof until engagement of the bridging gear set 18 with the first and second sets of meshed gears, 14 and 16, respectively. The first interdental stop 28 is formed in the fourth polysilicon layer.

In FIG. 1, the first interdental stop 28 is initially formed in the engaged position and is retained in that position by a first spring retainer until engagement of the bridging set of gears 18 with the first and second sets of meshed gears, 14 and 16. At that time, the first interdental stop 28 is moved to a disengaged position (see FIG. 5) so that the gears of the bridging set 18 are free to rotate. In FIG. 1, the first spring retainer comprises a pair of oppositely oriented leaf springs 30 formed in the fourth polysilicon layer and free-standing above the carriage 24 except for a connection to a support 32 formed in the fourth polysilicon layer and anchored to the third polysilicon layer. Pairs of guide pins 34 are formed from the fourth polysilicon layer on either side of the first interdental stop 28 to guide and limit movement of the stop 28. Additionally, a pair of retaining bridges are formed in the fourth and fifth polysilicon layers to surround the first interdental stop 28 and prevent any substantial vertical movement thereof (see FIG. 6a).

In FIG. 1, the carriage 24 further comprises a linear gear 36 formed in the second and third polysilicon layers, with the linear gear being operatively connected to a second motive source (not shown) through a gear train that includes drive gear 38. The second motive source can comprise an electrostatic motor. Rotation of the drive gear 38 can be used to move the linear gear 36 and attached carriage 24 along a track comprising a pair of guide rails 20.

Since the gear teeth of the bridging set 18 have micron-size vertical dimensions, means are preferably provided in the design and construction of the various mechanical elements of the MEM apparatus for controlling tolerances in the vertical dimension to preferably about 0.5 μm for each polysilicon structural layer, thereby limiting excess play in the vertical dimension during engagement of the bridging gear set 18 with the first and second sets of meshed gears, 14 and 16. The need for constraint on vertical tolerances is especially important for the bridging gear set 18 and supporting carriage 24, since the carriage 24 must be moveable over a predetermined distance while being slidingly engaged with a pair of guide rails 20 forming the track. For this purpose, dimple rings are formed in the hub 26 and gears of the bridging set 18 as described heretofore with reference to FIG. 2. Additionally, linear dimples 39 are provided in the carriage 24 and guide rails 20 to limit vertical play as shown in the plan view of FIG. 3a and the cross-sectional view of FIG. 3b. For clarity, other mechanical elements of the MEM apparatus 10 including the bridging gear set 18 have been omitted from FIGS. 3a and 3b.

Figure 6A:
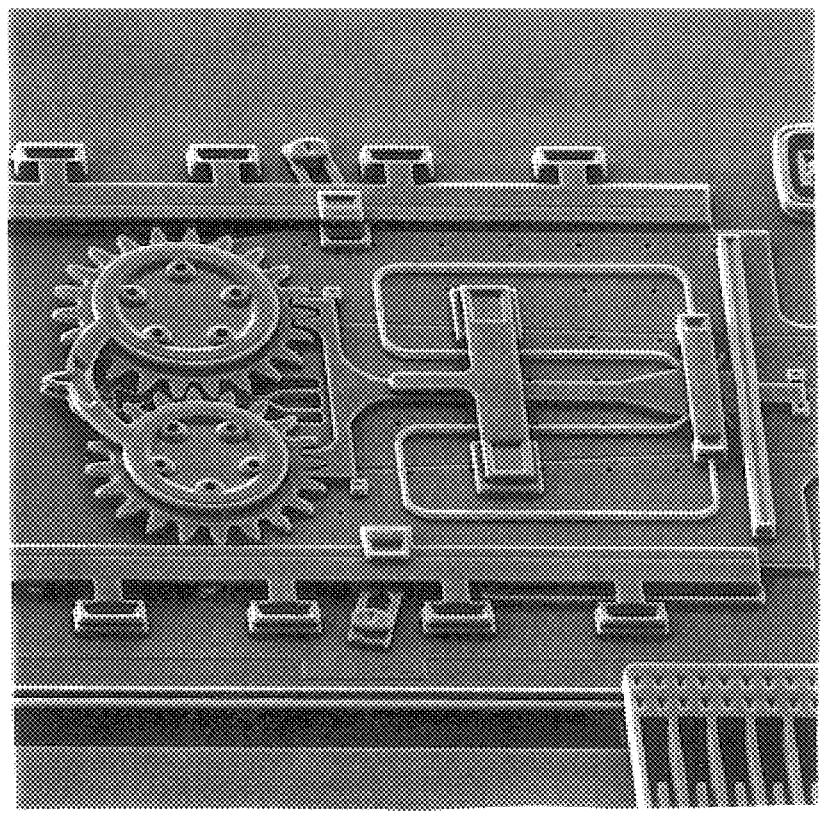
FIG. 6a shows an SEM photograph of a portion of the MEM apparatus of FIG. 1 showing details of the guide rails, the carriage containing the bridging set of gears, and the first interdental stop.

FIG. 6a shows an SEM photograph of a portion of the completed MEM apparatus 10 showing the guide rails 20, carriage 24 and mechanical elements formed thereon. The locations of the linear dimples 39 formed underneath the carriage 24 and guide rails 20 can be identified from thin generally horizontal lines on the guide rails 20 and carriage 24 due to draping of the deposited polysilicon into trenches formed in an underlying sacrificial layer to form the dimples 39.

Figure 3A:
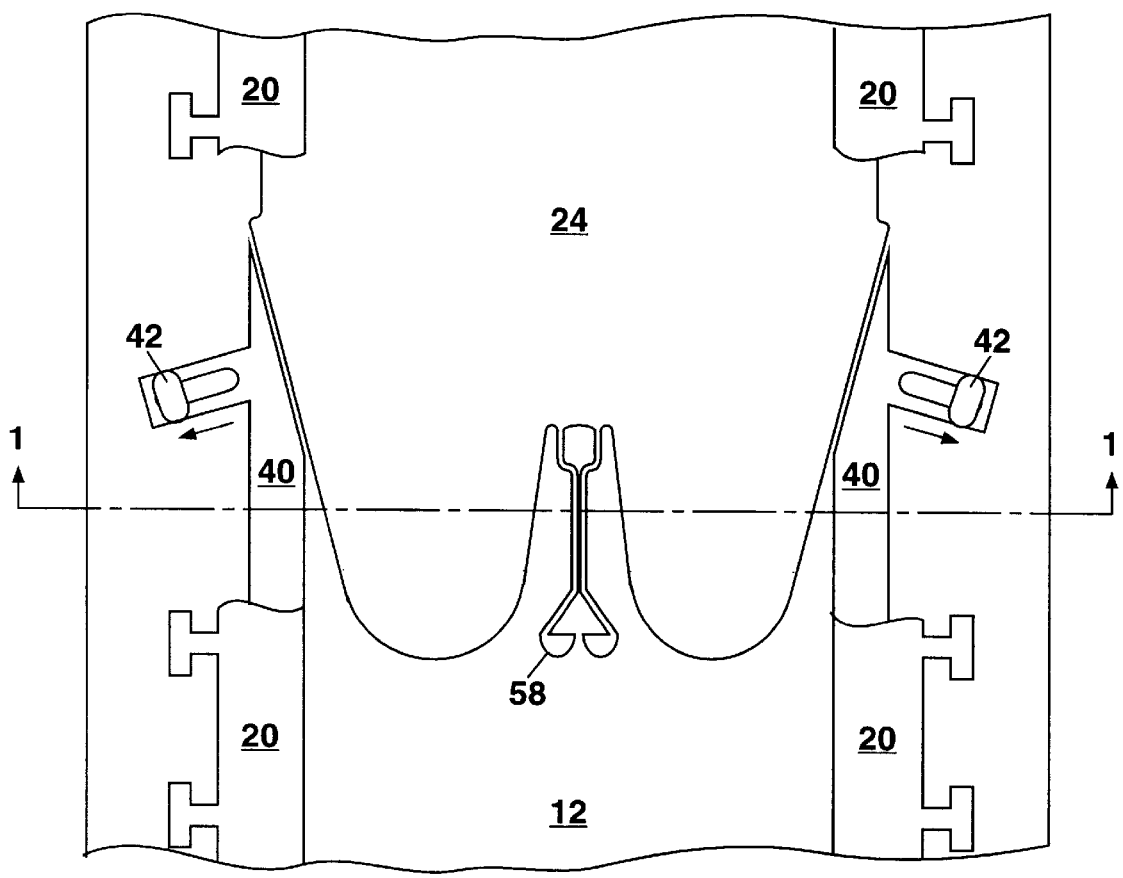
FIG. 3a shows a schematic partial plan view of the carriage and guide rails of the MEM apparatus to illustrate the formation and functioning of these elements of the present invention.
Figure 3B:
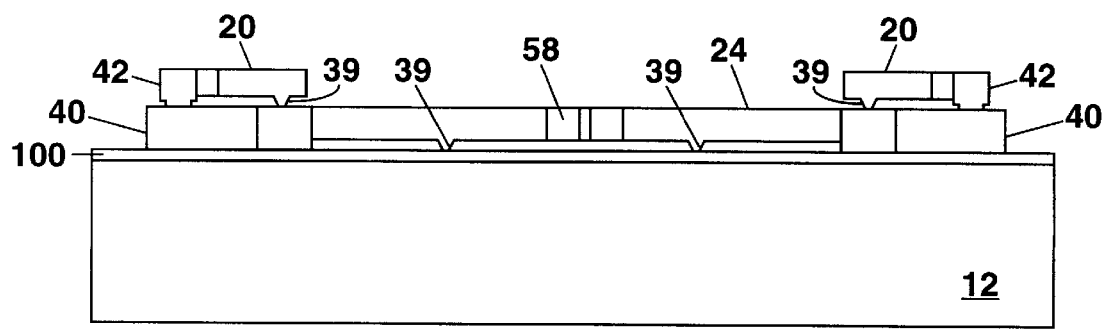

In FIG. 3b, the linear dimples 39 are formed underneath the carriage 24 using a timed etch to form trenches in the underlying sacrificial layer (not shown) prior to depositing the second polysilicon layer wherefrom the carriage 24 is formed. (In FIG. 3b, the first polysilicon layer has been labelled as 100.) To form linear dimples 39 underneath the guide rails 20 with the dimples extending over a length of travel of the carriage 24, spacer portions 40 of the second and third polysilicon layers (see FIGS. 3a and 3b) are photolithographically defined and left in place to support an overlying sacrificial layer. Trenches can then be etched through this sacrificial layer and a sacrificial material deposited to partially fill in the trenches to a predetermined layer thickness (e.g. 0.5 μm). Deposition and patterning of the fourth polysilicon layer then forms the guide rails 20 with linear dimples 39 therebelow as shown in FIG. 3b. The etch release step after completion of the structure of the MEM apparatus 10 removes the various sacrificial layers leaving the structure of the carriage 20 and guide rails 20 as shown in FIGS. 3a and 3b. Without the formation of the spacer portions 40, a precise vertical positioning of the sacrificial and polysilicon layers used to form the guide rails 20 would be problematic.

Figure 4A:
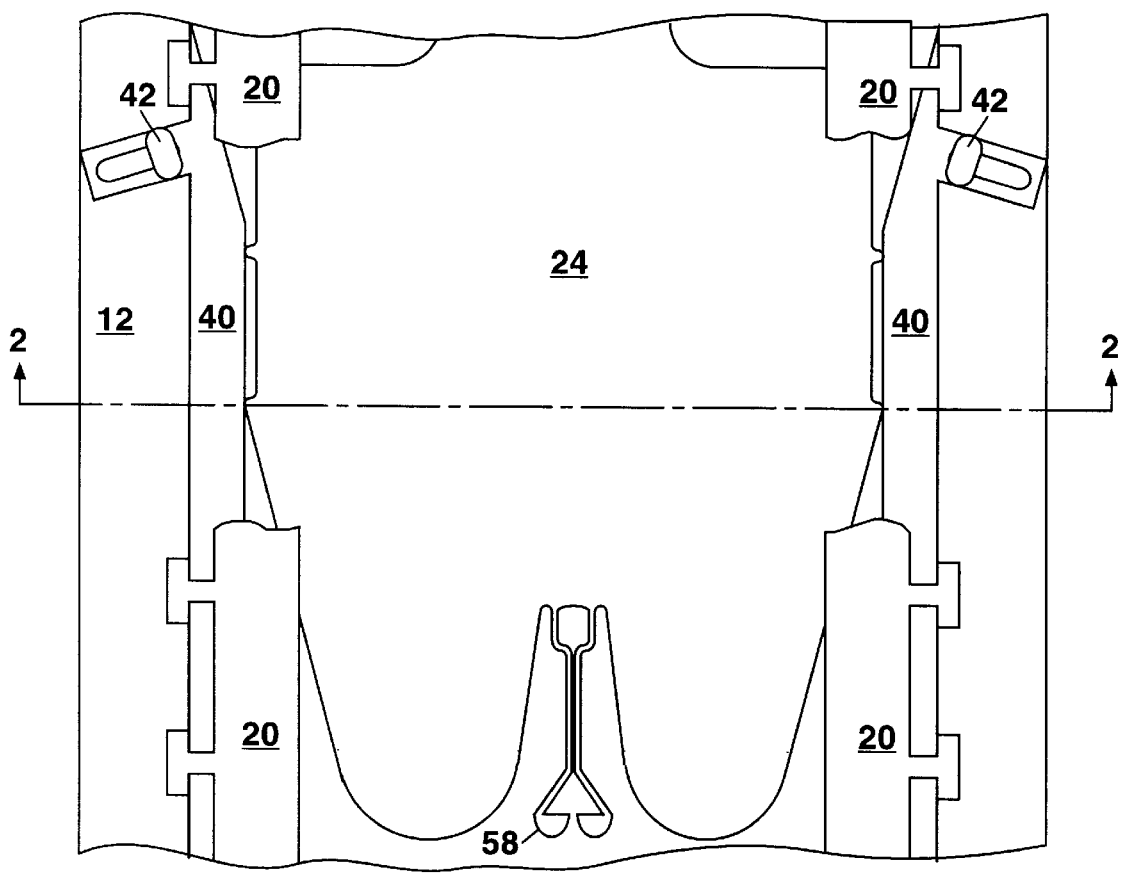
FIG. 4a shows a schematic partial plan view of the carriage and guide rails of FIG. 3a illustrating lateral displacement of spacer portions during forward travel of the carriage.
Figure 4B:
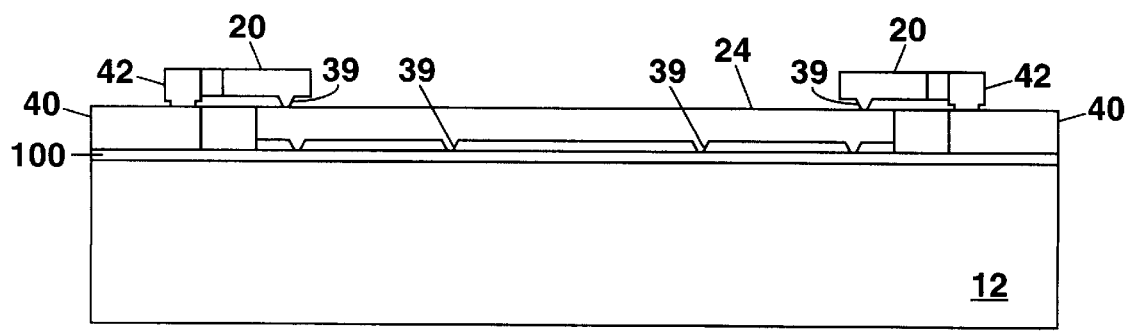

The location of the spacer portions 40 in the path of travel of the carriage 24 requires that the spacer portions 40 be moveable to the side of the carriage 24 during travel thereof. This is accomplished by tapering the sides of the carriage 24 and an adjoining end of each spacer portion 40. Movement of the carriage 24 then forces each spacer portion 40 to slide outward underneath the guide rails 20 which are cantilevered, thereby allowing the carriage 24 to pass by the spacer portions 40. The cantilevered design of the guide rails 20 limits lateral movement of the spacer portions 40 thereby constraining and limiting lateral movement of the carriage 24 as the carriage is moved forward by drive gear 38 to engage the bridging set of gears 18 formed thereon with the first and second sets of meshed gears, 14 and 16. The lateral displacement of the spacer portions 40 during travel of the carriage 24 is shown in FIGS. 4a and 4b. Additionally, FIGS. 3a and 4a show one of a plurality of notched tabs provided on each spacer portion 40 to hold the spacer portions 40 and guide movement thereof using polysilicon guide pins 42.

Figure 5:
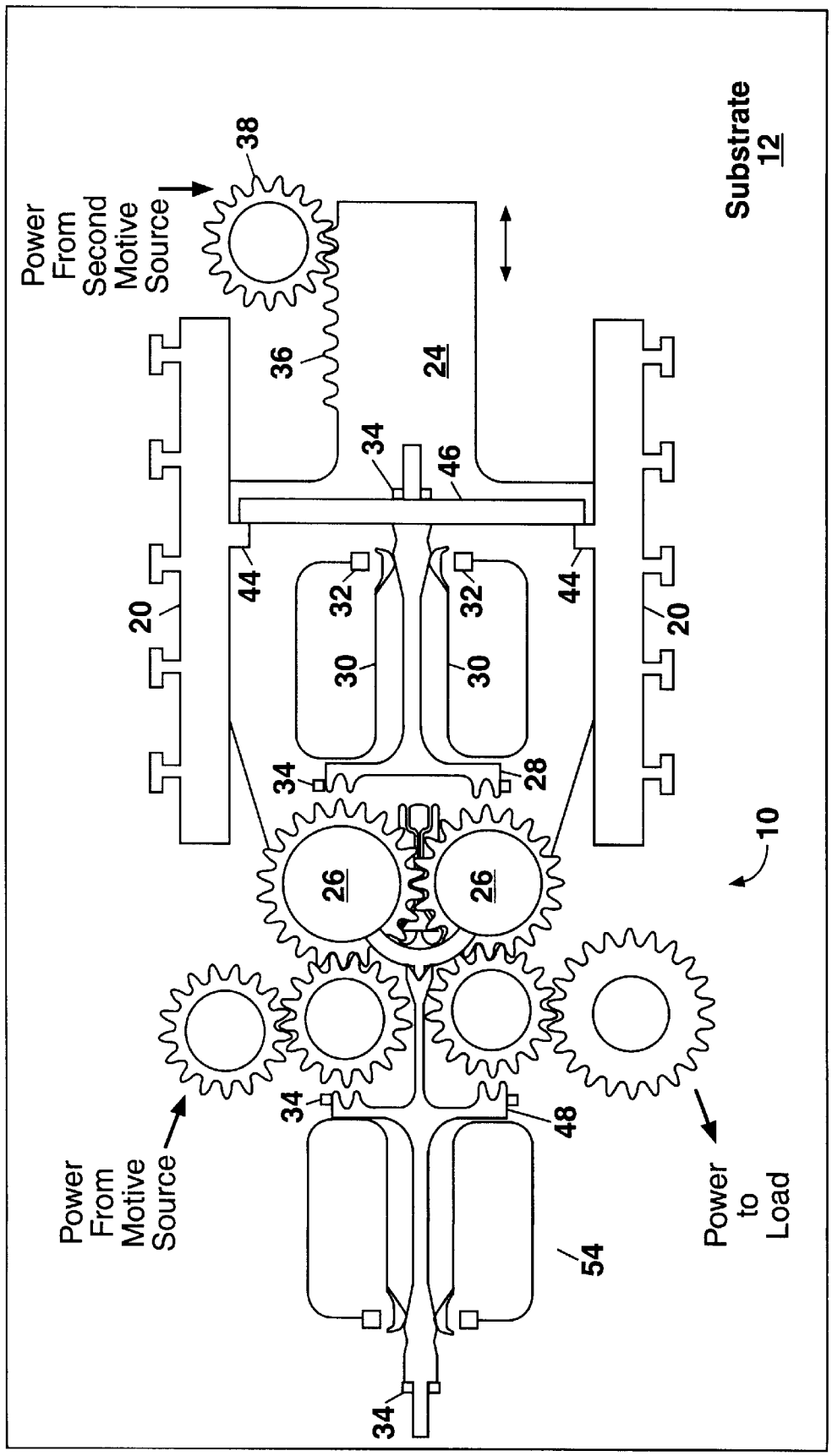
FIG. 5 shows the MEM apparatus of FIG. 1 with the carriage being moved to one end of its travel to engage the bridging gear set with the first and second sets of meshed gears, thereby enabling power transfer from the first motive source to the load.

Returning again to FIG. 1, the guide rails 20 are provided with a pair of tabs 44 extending inward over the carriage 24. During movement of the carriage 24 by drive gear 38, movement of a cross-bar 46 attached to the first interdental stop 28 is impeded by the tabs 44, thereby retracting stop 28 from its engaged position and moving the stop 28 to a disengaged position as shown in FIG. 5. Movement of the carriage 24 to the end of its path of travel as shown in FIG. 5 also results in a second interdental stop 48 being moved from an engaged position whereby motion of the first and second sets of meshed gears, 14 and 16, is impeded to a disengaged position where individual gears in the sets of meshed gears are free for rotation.

Figure 6B:
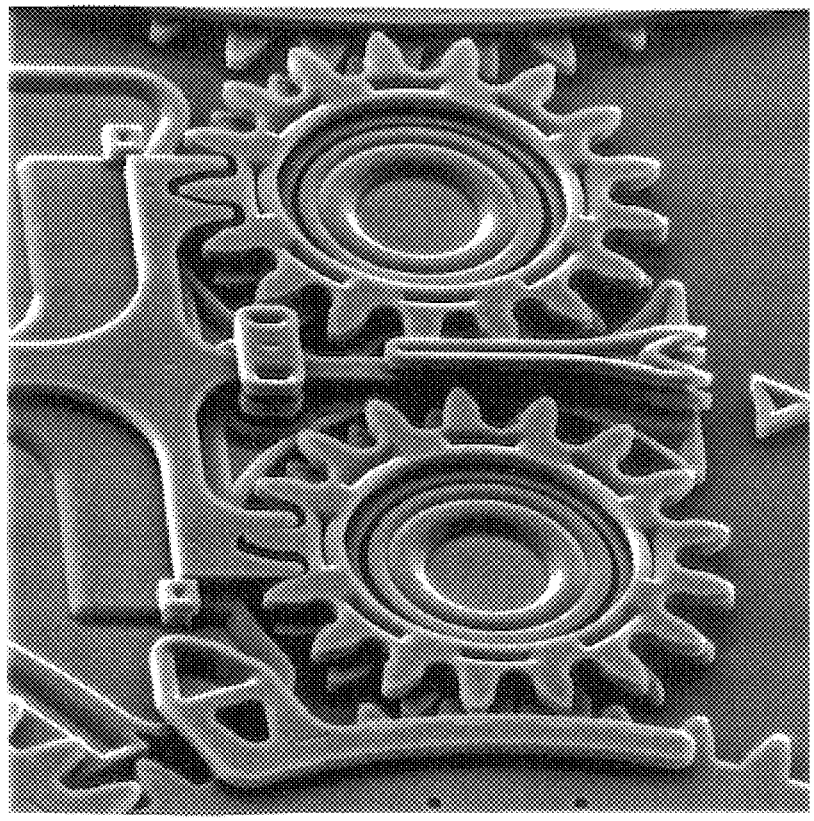
FIG. 6b shows an SEM photograph of a portion of the MEM apparatus of FIG. 1 showing details of the first and second sets of meshed gears, and the second interdental stop.

The gears with which the second interdental stop 48 engage are preferably each formed as a pair of ganged or stacked gears, with each gear in the pair having the same size and tooth count, and with the stacked gears being formed connected together on a common hub. This can be seen in FIG. 6b which shows a lower gear of each pair formed in the third polysilicon layer, and an upper gear of each pair formed in the fourth polysilicon layer. The interconnection of the stacked gears is performed by patterning and etching a plurality of annular notches or through holes in the underlying sacrificial layer prior to deposition of the fourth polysilicon layer. The stacked gears can be offset at an angle from each other as shown in FIG. 6b to provide alignment with the various other elements of the MEM apparatus 10 with which these gears must mesh. Additionally, the use of stacked gears provides added freedom in the design of the MEM apparatus 10 by allowing meshing of gears with other gears in each set, 14 or 16, to occur at the third polysilicon level, while allowing engagement with the bridging set of gears 18 to occur at the fourth polysilicon level. Engagement of the second interdental stop 48 also occurs at the fourth polysilicon level wherein the stop 48 is formed (see FIG. 6b).

Disengagement of the second interdental stop 48 is accomplished by an arched tang 50 formed in the fourth and fifth polysilicon layers, with the arched tang 50 being connected to the pair of hubs 26 of the bridging set of gears 18 as shown in FIG. 1. During movement of the carriage 24, the arched tang 50 intercepts a notched tang 52 formed in the fourth and fifth polysilicon layers as a part of the second interdental stop 48, thereby pushing the stop 48 away from the first and second sets of meshed gears, 14 and 16, as shown in FIGS. 1 and 5 (see also FIGS. 6a and 6b). In FIG. 5, guide pins 34 guide travel of the second interdental stop 48, with a second spring retainer 54 that is formed similarly to the first spring retainer being provided to lock the second interdental stop 48 in the disengaged position. The guide pins 34 and the second spring retainer 54 are formed in the fourth polysilicon layer, while bridges overlying the second interdental stop 48 are formed in the fourth and fifth polysilicon layers (see FIG. 6b).

Movement of the carriage 24 over its length of travel as shown in FIG. 5 enables the transfer of power from the first motive source to a load across the first and second sets of meshed gears, 14 and 16, using the bridging set of gears 18 which are moved into the engaged position. To lock the sets of gears 14, 16 and 18 in an enabled position for uninterrupted power transfer, a shaped protrusion or locking pin 56 can be formed on the substrate (e.g. in the third polysilicon layer) as shown in FIG. 1. A capture spring 58 can be formed on the carriage (see FIGS. 1, 3a and 6a) to snap around and engage the shaped protrusion 56 at the end of travel of the carriage 24, thereby restraining linear movement of the carriage 24 upon engagement of the bridging gear set 18 with the first and second sets of meshed gears, 14 and 16.

For other embodiments of the present invention in which the bridging gear set 18 is to be formed disengageably from the first and second sets of meshed gears, 14 and 16, to repeatedly enable and interrupt power transfer, the shaped protrusion 56 and capture spring 58 can be omitted, with the drive gear 38 being used both to control and lock the position of the carriage 24 at the end of its travel. Additionally, an optional pin-in-maze discriminator can be provided to control either the movement of the linear gear 36 or the drive gear 38 using a predetermined coded signal.

Figure 7:
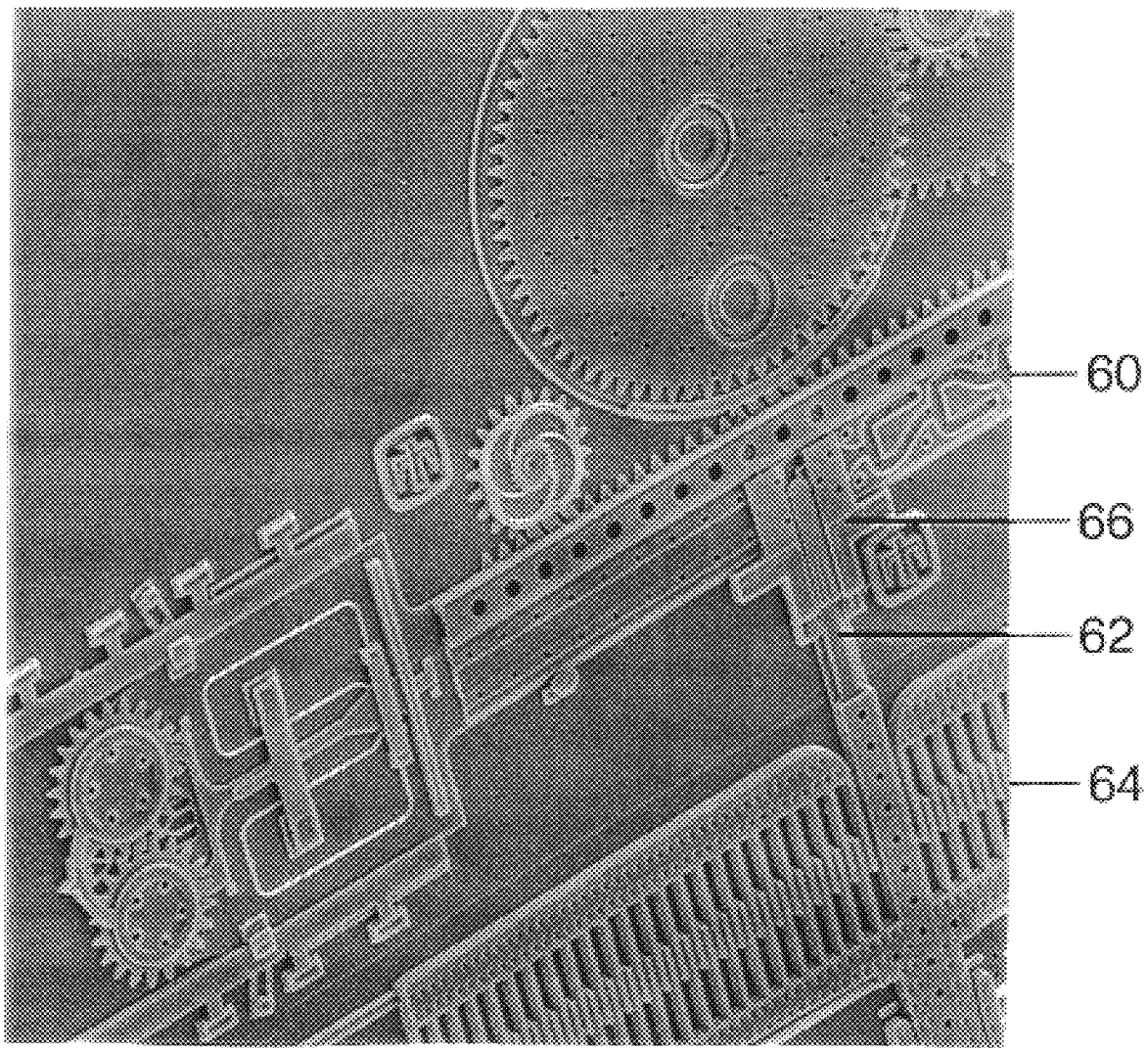
FIG. 7 shows an SEM photograph of a portion of an optional pin-in-maze discriminator that can be used with embodiments of the MEM apparatus of FIG. 1.

U.S. Pat. No. 5,626,040, which is incorporated herein by reference, describes the formation of a rotary pin-in-maze discriminator that can be used to control the delivery of mechanical power from the second motive source to control and enable movement of the drive gear 38 and the linear gear 36. Alternatively, a linear pin-in-maze discriminator can be formed on the carriage 24 adjacent to the linear gear 36 by forming a maze 60 in the fourth polysilicon layer as shown in FIG. 7. The maze 60 comprises a plurality of decision points, with each decision point comprising two advancement choices for an electrostatically-driven pin which traverses the maze. One of the advancement choices leads to a dead end in the maze 60; whereas the other advancement choice allows the drive gear 38 to advance movement of the carriage 24 along a portion of its path of travel. Each decision point requires the pin, which is formed from the third polysilicon layer underneath the end of an output beam 62 and connected thereto, to be moved by a linear electrostatic comb actuator 64 either forward or backward along a pair of guides 66 in response to a digital code (i.e. a digital voltage) provided to the linear electrostatic comb actuator 64.

The linear electrostatic comb actuator 64 comprises one or more pair of intermeshed electrostatic combs as shown in FIG. 7, with each electrostatic comb preferably being formed from multiple interconnected (i.e. ganged) polysilicon layers (e.g. from the second, third, fourth and fifth polysilicon layers) to provide an increased electrostatic force. Similarly, a plurality of ganged polysilicon layers can be used to form the output beam 62 to provide an increased out-of-plane stiffness. Finally, the first and second motive sources can comprise a plurality of ganged polysilicon layers (e.g. to form electrostatic comb actuators and linkages therefrom) to provide an increased output torque for driving the first set of meshed gears 14, or the drive gear 38.

Figure 8:
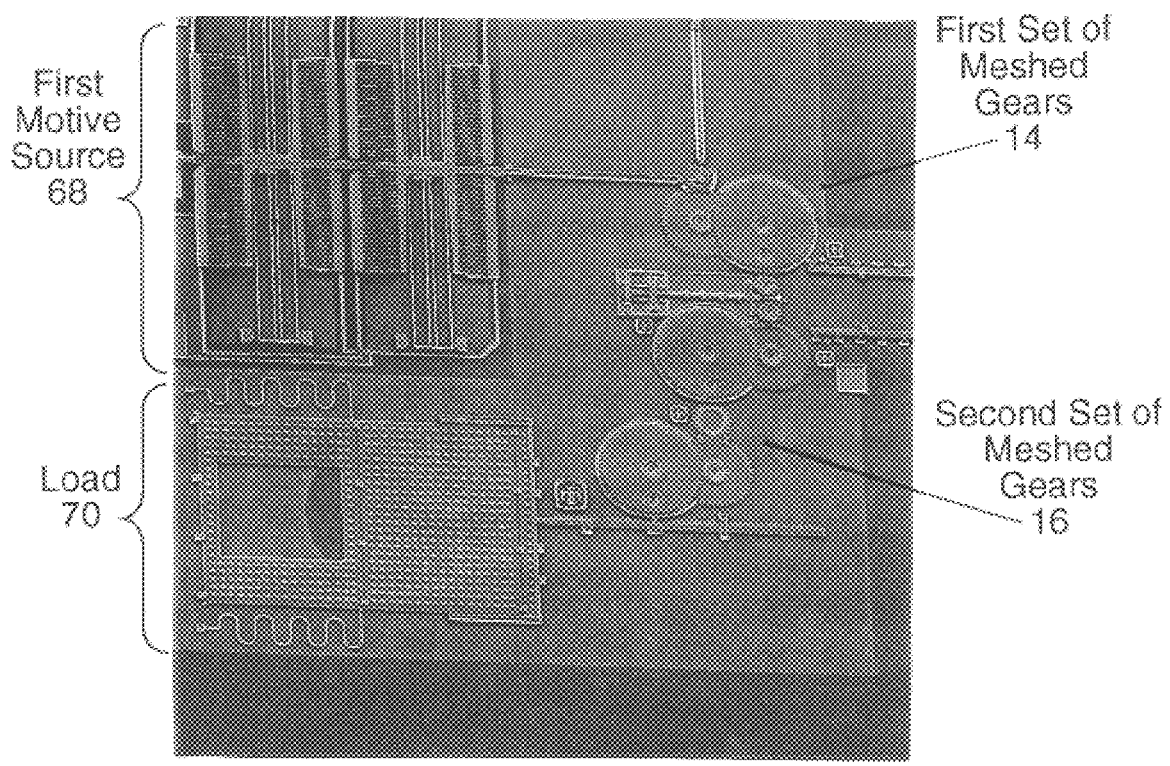
FIG. 8 shows an SEM photograph of a portion of the MEM apparatus of FIG. 1 showing the first motive source coupled to the first set of meshed gears, and the load coupled to the second set of meshed gears.

FIG. 8 shows an SEM photograph of the first motive source 68 in the form of an electrostatic motor formed as described in U.S. Pat. No. 5,631,514 which is incorporated herein by reference. The first motive source 68 comprises a pair of linear electrostatic actuators formed on the substrate 12 at right angles to each other with linkages connected to an off-axis pin joint of an output gear which is coupled to drive the first set of meshed gears 14. Also shown in FIG. 8 is a load 70 formed on the substrate 12 by surface micromachining. The load 70 in this example of the present invention comprises a self-assembling structure in the form of a hinged mirror coupled to the second set of meshed gears 16 by a linear gear. In FIG. 8, the hinged mirror 70 is shown in an as-formed or unassembled position.

In FIG. 8, the bridging gear set 18 is not visible since it is not engaged with the first and second sets of meshed gears, 14 and 16, and thereby prevents power transfer from the first motive source 68 to the load 70. Upon movement of the carriage 24 and bridging gear set 18 along the track shown on the right side of FIG. 8, the bridging gear set 18 can be engaged with the first and second sets of meshed gears, 14 and 16, thereby allowing mechanical power to be coupled across the sets of meshed gears, 14 and 16, to move a linear gear connected to the hinged mirror 70 to the left, thereby assembling the mirror 70 to a predetermined position (e.g. at a 45° angle) above the substrate 12. The assembled mirror 70 can then be used to reflect a laser beam that is incident on an underneath reflective surface of the mirror from below the substrate 12 through an aperture formed therein below the mirror 70. The mirror 70 can thus redirect the laser beam parallel to the surface of the substrate 12, where the laser beam can be intercepted by a second MEM apparatus 10 and a second self-assembled mirror (neither of which are shown in FIG. 8) formed on the same substrate 12, so that the second mirror can direct the laser beam downward through a second aperture in the substrate 12 to a photodetector. Such a device has applications for forming an optically-activated surety device for use as a safety component to prevent the occurrence of catastrophic accidents (e.g. for aircraft, nuclear reactors, chemical processing plants, or robotic handing of hazardous or radioactive material).

As described herein, the five-step polysilicon process for forming the MEM apparatus 10 can use many individual photolithographic reticles (i.e. masks) for defining the various mechanical elements and features thereof as shown in FIGS. 1–8, and can further comprise up to hundreds of individual process steps. Only the handful of process steps that are relevant to the present invention have been described herein. Those skilled in the art will understand the use of conventional surface micromachining process steps of polysilicon and sacrificial layer deposition, photolithographic definition, and reactive ion etching which have not been described herein in great detail.

The method of the present invention can be applied to the formation of other types of microelectromechanical devices utilizing five levels of polysilicon. Since the complexity of microelectromechanical devices that can be fabricated with a polysilicon surface micromachining technology scales super-linearly with the number of polysilicon layers that can be deposited and patterned, the five-level polysilicon method of the present invention represents a significant advance in the art of surface micromachining and will enable the formation of MEM devices having a high level of complexity and functionality compared with previous MEM devices formed from a smaller number of polysilicon layers.

The matter set forth in the foregoing description and accompanying drawings is offered by way of illustration only and not as a limitation. Other applications and variations of the MEM method and apparatus of the present invention will become evident to those skilled in the art. Although the bridging gear set 18 has been shown and described with two gears, other numbers of gears can be arranged on the moveable carriage 24. For example, the use of an even number of meshed gears on the moveable carriage 24 can be used to provide power transfer in one direction of rotation to the gear of the second set of meshed gears 16 which engages with the bridging gear set 18; whereas the use of an odd number of meshed gears on the moveable carriage 24 can be used to provide power transfer in an opposite direction of rotation. Additionally, although the MEM apparatus 10 has been described herein for use with a motive source comprising an electrostatic motor, those skilled in the art will understand that the apparatus 10 can be used with other types of micromachined motive sources, including pneumatic turbines. The actual scope of the invention is intended to be defined in the following claims when viewed in their proper perspective based on the prior art.

What is claimed is:

1. A microelectromechanical (MEM) apparatus, comprising:
   (a) a plurality of gears on a silicon substrate forming an incomplete gear train; and
   (b) a bridging set of gears located on a carriage, with the bridging set of gears and the carriage being moveable on the silicon substrate from a disengaged state to engage the plurality of gears, thereby completing the gear train.

2. The MEM apparatus of claim 1 wherein each gear comprises polycrystalline silicon.

3. The MEM apparatus of claim 1 further comprising a track for guiding motion of the carriage.

4. The MEM apparatus of claim 3 wherein the track comprises a pair of guide rails with the carriage being slidingly engaged with the guide rails of the track.

5. The MEM apparatus of claim 3 wherein the carriage further comprises a linear gear formed on one side thereof to impart linear motion thereto.

6. The MEM apparatus of claim 5 further comprising means for driving the linear gear.

7. The MEM apparatus of claim 1 wherein the plurality of gears comprises a first set of meshed gears and a second set of meshed gears, with the sets of meshed gears being spaced at a distance from each other to prevent mechanical coupling therebetween.

8. The MEM apparatus of claim 7 further comprising a motive source formed on the substrate and operatively connected to an input gear of the first set of meshed gears.

9. The MEM apparatus of claim 8 wherein the motive source comprises an electrostatic motor.

10. The MEM apparatus of claim 8 further comprising a load operatively connected to an output gear of the second set of meshed gears.

11. The MEM apparatus of claim 10 wherein the load comprises a self-assembling structure.

12. The MEM apparatus of claim 10 further including locking means for maintaining the bridging gear set and the first and second sets of meshed gears in an enabled position for uninterrupted power transfer upon engagement of the bridging gear set with the first and second sets of meshed gears.

13. A microelectromechanical (MEM) apparatus formed on a silicon substrate for controlling the transfer of power from a motive source to a load, comprising an interruptible gear train formed on the silicon substrate, with the interruptible gear train further comprising:
   (a) a first set of meshed gears operatively connected to the motive source;
   (b) a second set of meshed gears operatively connected to the load; and
   (c) a bridging gear set moveable along a track for engagement with the first and second sets of meshed gears thereby enabling power to be transferred from the motive source to the load.

14. The apparatus of claim 13 wherein the bridging gear set comprises a pair of gears with each gear of the pair having a different number of teeth.

15. The apparatus of claim 13 wherein the motive source comprises an electrostatic motor.

16. The apparatus of claim 13 wherein the load comprises a self-assembling structure.

17. The apparatus of claim 13 wherein each gear comprises polycrystalline silicon.

18. The apparatus of claim 13 wherein the interruptible gear train comprises a reducing gear train for reducing a rotation speed of the motive source.

19. The apparatus of claim 13 wherein the bridging gear set comprises at least one gear formed on a hub secured to a moveable carriage, with the carriage having opposite sides thereof slidingly engaged with guide rails of the track to provide for linear movement of the carriage and bridging gear set along the track.

20. The apparatus of claim 19 wherein the carriage further comprises a linear gear formed on one side thereof to impart linear motion to the carriage and bridging gear set formed thereon.

21. The apparatus of claim 20 wherein the linear gear is operatively connected to another motive source.

22. The apparatus of claim 19 wherein the moveable carriage further includes a capture spring for engagement with a shaped protrusion formed on the substrate to restrain linear movement of the carriage upon engagement of the bridging gear set with the first and second sets of meshed gears.

23. The apparatus of claim 19 wherein the moveable carriage further includes a first interdental stop moveable from an engaged position to a disengaged position, the first interdental stop being initially in the engaged position whereby the first interdental stop is engaged with teeth on at least one gear of the bridging gear set thereby aligning each gear in the bridging gear set to facilitate engagement with the first and second sets of meshed gears.

24. The apparatus of claim 23 further including a second interdental stop proximate to the first and second sets of meshed gears, with the second interdental stop being moveable from an engaged position whereby rotation of the first and second sets of meshed gears is prevented to a disengaged position whereby rotation of the first and second sets of meshed gears is enabled upon engagement of the bridging gear set with the first and second sets of meshed gears.

25. The apparatus of claim 24 further including means for moving each interdental stop from the engaged position to the disengaged position as the bridging gear set is moved into engagement with the first and second sets of meshed gears.

26. The apparatus of claim 25 further including means for locking each interdental stop in the disengaged position upon engagement of the bridging gear set with the first and second sets of meshed gears.

27. A microelectromechanical apparatus, formed on a silicon substrate comprising:
 (a) an electrostatic motor comprising a rotatable output gear for providing mechanical power therefrom;
 (b) a plurality of sets of meshed gears forming an incomplete gear train with an input gear of the gear train engaging the rotatable output gear of the electrostatic motor for receiving mechanical power therefrom;
 (c) at least one gear moveable along a track to engage the plurality of gears and complete the gear train, thereby coupling the mechanical power across the gear train.

28. A method for forming a microelectromechanical (MEM) apparatus, comprising steps for:
 (a) depositing and patterning five layers of polysilicon above a silicon substrate, including a first polysilicon layer for forming a voltage reference plane, and four polysilicon layers overlying the first polysilicon layer for forming structural layers wherefrom mechanical elements of the MEM apparatus are formed;
 (b) annealing each of the first, second and third structural polysilicon layers prior to patterning each of these layers; and
 (c) annealing the fourth structural polysilicon layer after patterning thereof.

29. The method of claim 28 further including a step for depositing a sacrificial layer between each layer of polysilicon.

30. The method of claim 29 wherein the sacrificial layer comprises silicon dioxide or a silicate glass.

31. The method of claim 29 further including a step for planarizing at least one sacrificial layer after deposition thereof.

32. The method of claim 31 wherein the planarization step comprises planarizing the sacrificial layer by chemical-mechanical polishing.

33. The method of claim 29 further including a step for patterning each sacrificial layer after planarization thereof.

34. The method of claim 29 wherein each-patterning step comprises steps for photolithographically defining features to be formed in one of the polysilicon layers and forming the features by etching.

35. The method of claim 34 wherein the etching step comprises reactive ion etching.

36. The method of claim 29 further including a step for releasing the MEM apparatus by removing the sacrificial layers by etching.

* * * * *